(12) United States Patent  
Carreau

(10) Patent No.: US 8,564,464 B2  
(45) Date of Patent: Oct. 22, 2013

(54) TECHNIQUES FOR REDUCING CORRELATED ERRORS IN MULTI-CHANNEL SAMPLING SYSTEMS

(75) Inventor: Gary Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 137 days.

(21) Appl. No.: 13/241,927

(22) Filed: Sep. 23, 2011

(65) Prior Publication Data

US 2013/0076402 A1    Mar. 28, 2013

(51) Int. Cl.
*H03M 1/00* (2006.01)

(52) U.S. Cl.
USPC .......................................... 341/122; 341/155

(58) Field of Classification Search
USPC .................................. 341/122, 155
See application file for complete search history.

(56) References Cited

U.S. PATENT DOCUMENTS

| | | | |
|---|---|---|---|
| 5,144,308 A | 9/1992 | Norsworthy | |
| 5,724,383 A | 3/1998 | Gold et al. | |
| 5,889,482 A | 3/1999 | Zarubinsky et al. | |
| 6,084,538 A | 7/2000 | Kostelnik et al. | |
| 6,172,629 B1 | 1/2001 | Fetterman | |
| 6,351,229 B1 | 2/2002 | Wang | |
| 6,518,907 B2 * | 2/2003 | Tsai | 341/155 |
| 6,831,574 B1 | 12/2004 | Mills et al. | |
| 6,842,136 B1 * | 1/2005 | Agarwal et al. | 341/155 |
| 6,880,262 B1 | 4/2005 | Jensen | |
| 7,068,319 B2 * | 6/2006 | Barna et al. | 348/372 |
| 7,443,331 B2 * | 10/2008 | Cormier, Jr. | 341/155 |
| 7,880,662 B2 * | 2/2011 | Bogaerts | 341/169 |
| 8,310,387 B2 * | 11/2012 | Harris et al. | 341/155 |
| 2005/0146453 A1 | 7/2005 | Jensen et al. | |
| 2006/0038712 A1 | 2/2006 | Harrison et al. | |
| 2007/0076269 A1 * | 4/2007 | Kido et al. | 358/474 |
| 2008/0013720 A1 | 1/2008 | Degele | |

OTHER PUBLICATIONS

PCT International Search Report and Written Opinion for PCT/US2010/42688 mailed on Sep. 14, 2010.

* cited by examiner

*Primary Examiner* — Khai M Nguyen
(74) *Attorney, Agent, or Firm* — Kenyon & Kenyon LLP

(57) ABSTRACT

Techniques to reduce correlated errors in a multi-channel sampling system. A plurality of clock signals may be generated from a master clock signal, each with edges offset from each other. The offset clock signals may be distributed to a plurality of sampling devices. Each sampling device may capture a respective input signal according to its offset clock. In this manner, the sampling units may sample their inputs signals over a distributed window of time rather than sampling in response to a common clock edge. By distributing the switching operations performed by the sampling units, noise effects are likely to be reduced.

25 Claims, 9 Drawing Sheets

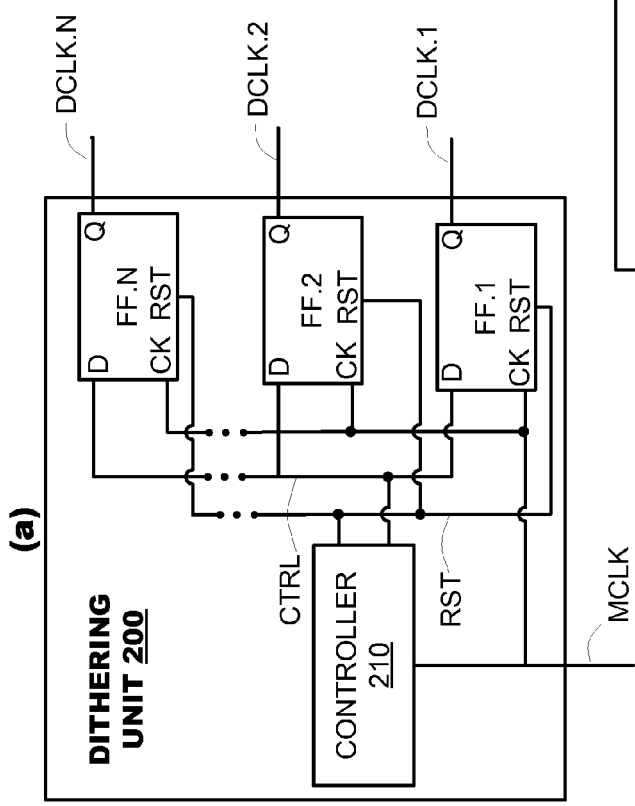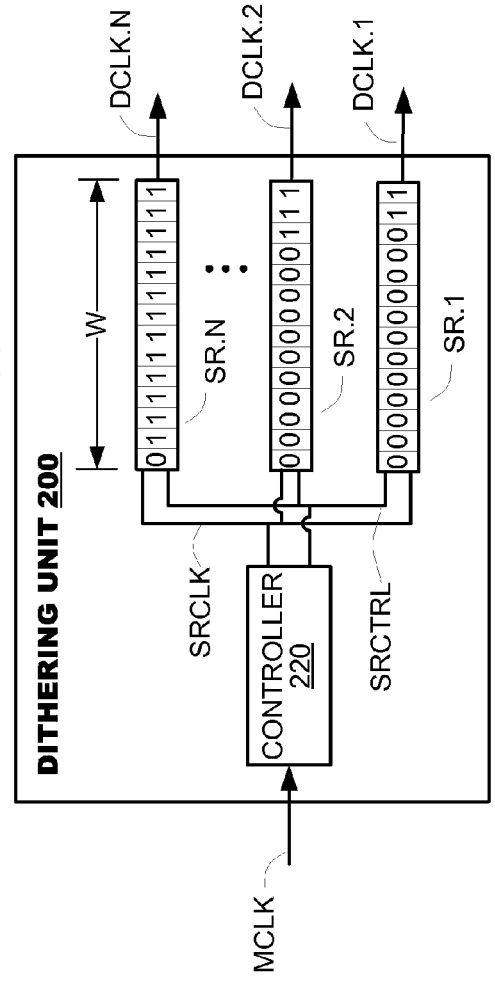
FIG. 2

FIG. 9
900
(a)
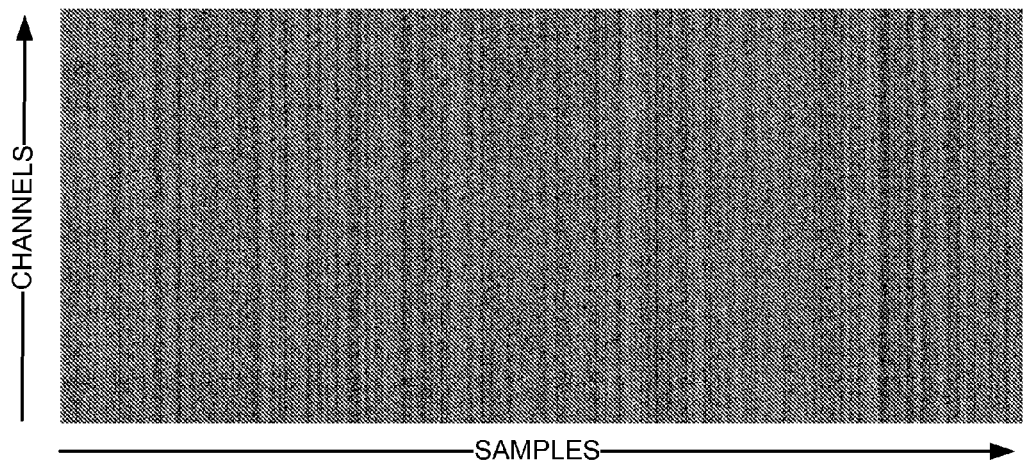
(b)
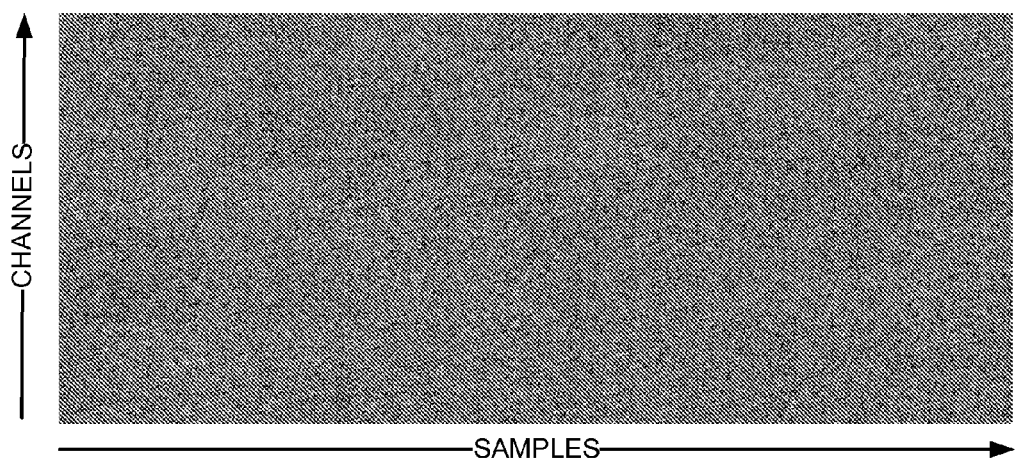

TECHNIQUES FOR REDUCING CORRELATED ERRORS IN MULTI-CHANNEL SAMPLING SYSTEMS

BACKGROUND

Within an integrated circuit (IC), a multi-channel signal processing system samples multiple data channels simultaneously in response to a common clock. Within the processing system, separate sampling units sample each data channel simultaneously. In large processing systems, switching effects that occur as each sampling unit captures its input signals can induce correlated noise errors. Consider, for example, sampling units provided within an image sensor. An image sensor may provide a sampling unit for each column of a sensor array, which may number in the thousands for modern arrays. Simultaneously switching the sampling units may induce noise from voltage supplies and other sources in the system which is captured as correlated noise in the signals captured by each sampling unit. In image sensor applications, the correlated noise may be a visible artifact in a recovered image signal.

Accordingly, there is a need in the art to provide sampling techniques for multi-channel sampling systems that reduce correlated errors in the system.

BRIEF DESCRIPTION OF THE DRAWINGS

FIG. 2 illustrates configurations for a dithering unit according to an embodiment of the present invention.

FIG. 9 provides images illustrating correlated noise reduction for an image processing system using embodiments of the present invention.

DETAILED DESCRIPTION

Embodiments of the present invention provide sampling techniques to reduce correlated errors in a multi-channel sampling system. A plurality of clock signals may be generated from a master clock signal, each with edges offset from each other. The offset clock signals may be distributed to a plurality of sampling devices. Each sampling device may capture a respective input signal according to its offset clock. In this manner, the sampling units may sample their inputs signals over a distributed window of time rather than sampling in response to a common clock edge. By distributing the switching operations performed by the sampling units, noise effects are likely to be reduced.

Figure 1:
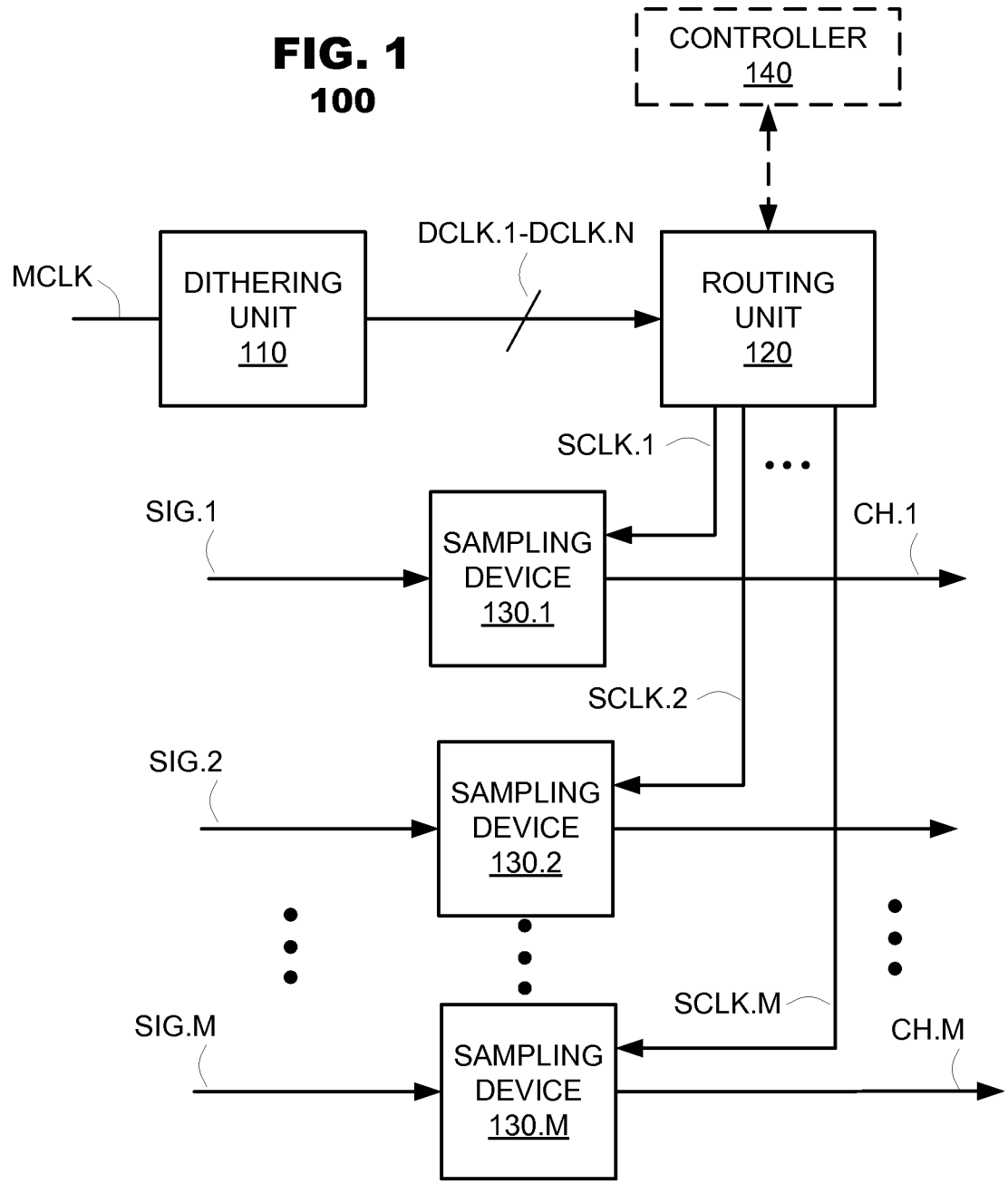
FIG. 1 illustrates a multi-channel sampling system according to an embodiment of the present invention.

FIG. 1 illustrates a multi-channel sampling system 100 according to an embodiment of the present invention. The system 100 may include a dithering unit 110 which may receive a master clock signal (MCLK) and generate a plurality of sub-clock clock signals DCLK.1-DCLK.N (called "dithered clock signals" herein) and a routing unit 120 that may receive the dithered clock signals DCLK.1-DCLK.N from the dithering unit 110 and may distribute the dithered clock signals DCLK.1-DCLK.M as a plurality of sampling clock signals SCLK.1-SCLK.M to a plurality of sampling devices 130.1-130.M (also referred to as sampling units).

Each sampling device 130.1-130.M may further receive a respective data signal SIG.1-SIG.N and may capture respective data signals SIG.1-SIG.M through successive sampling events to generate respective sampled data signals CH.1-CH.M. Each sampling event may occur at a time determined by the received sampling clock SCLK.1-SCLK.M. In aggregate, the various sampling device 130.1-130.M may sample the input signals over a window of time defined by the distribution of edges among the sampling clocks SCLK.1-SCLK.M. Because the operations of the sampling units 130.1-130.M are distributed over this window, the switching events of the sampling units 130.1-130.M likely will induce lower noise artifacts from voltage supplies within the circuit and, therefore, should reduce correlated error.

During operation, the dithering unit 110 may generate the dithered clock signals DCLK.1-DCLK.N. Each dithered clock signal DCLK.1-DCLK.N may have a predetermined clock interval, wherein the clock interval of each may be offset from one another. The dithered clock signals DCLK.1-DCLK.N may be input to the routing unit 120, which may distribute the clock signals DCLK.1-DCLK.N to the sampling units 130.1-130.M. Configuration of the routing unit 120 may be changed from clock cycle-to-clock cycle which may allow timing of the sampling events at each sampling unit 130.1-130.M to be randomized.

For example, say data signal SIG.1 may be input to sampling device 130.1. Sampling device 130.1 may receive a sampling clock signal SCLK.1 from the routing unit 120. For a first sampling event of SIG.1, the routing unit 120 may route the dithered clock signal DCLK.4 to sampling device 130.1. Thus, the sampling device 130.1 may sample SIG.1 at a time determined by the offset of clock DCLK.4. For a second sampling event of SIG.1, the routing unit 120 may distribute the dithered clock signal DCLK.7 to sampling device 130.1. Thus, the sampling device 130.1 may sample SIG.1 at a time determined by the offset of clock DCLK.7.

In an embodiment, the number of N dithered clock signals DCLK.1-DCLK.N may be less than the number of M data signals SIG.1-SIG.M input to the system 100. In such an embodiment, the routing unit 120 may distribute each sampling clock SCLK.1-SCLK.M to multiple sampling units 130. As noted, an image sensor may have several thousand sampling units, one provided for each column of an image sensor array. In such an embodiment, it may be sufficient to generate 16 dithered clock signals DCLK.1-DCLK.16 and distribute each clock signal to $1/16^{th}$ the number of sampling units.

In another embodiment, the number of N dithered clock signals DCLK.1-DCLK.N may be equal to the number of M data signals SIG.1-SIG.M input to the system 100. In such an embodiment, the routing unit 120 may distribute a unique sampling clock SCLK to each of the sampling devices 130.1-130.M. For example, say the system 100 may have 16 sampling devices 130.1-130.16 receiving 16 data signals SIG.1-SIG.16 and the dithering unit may generate 16 dithered clock signals DCLK.1-DCLK.16. In this example, sampling unit 130.1 may receive sampling clock SCLK.1, sampling device 130.2 may receive sampling clock SCLK.2, and so on for a first sampling event. For a second sampling event, each of the sampling clocks SCLK.1-SCLK.16 may be randomly redistributed to the sampling devices 130.1-130.16.

In another embodiment, the number of N dithered clock signals DCLK.1-DCLK.N may be greater than the number of M data signals SIG.1-SIG.M input to the system 100. In such an embodiment, the routing unit 120 may distribute a subset of the sampling clocks SCLK.1-SCLK.M to a subset of the sampling devices 130.1-130.M.

In an embodiment, the dithering unit 110 may include a timer and flip-flop array to generate dithering clocks DCLK.1-DCLK.N. In another embodiment, the dithering unit 110 may include logic for a buffer array to generate dithering clocks DCLK.1-DCLK.N. In another embodiment, the dithering unit 110 may include a plurality of shift registers to generate dithering clocks DCLK.1-DCLK.N.

In an embodiment, the routing unit 120 may receive a control signal from a controller 140 that may configure the routing for routing unit 120. In an embodiment, the routing unit 120 may distribute the dithered clock signals DCLK.1-DCLK.N to the sampling units 130.1-130.M in a pseudo-random manner. In another embodiment, the routing unit 120 may distribute the dithered clock signals DCLK.1-DCLK.N to the sampling units 130.1-130.M in a fixed-cycle manner.

In an embodiment, each of the sampling devices 130.1-130.M may be configured as an analog-to-digital converter (ADC) with a switch controlled sampling capacitor. In another embodiment, each of the sampling devices 130.1-130.M may be configured as a sample and hold device. In another embodiment, each of the sampling devices 130.1-130.M may be configured as a correlated double sampling (CDS) device, with a pair of switch-controlled sampling capacitors; a first capacitor may sample a reset value of an input signal and a second capacitor may sample a signal value of the input signal. In an embodiment, the dithering unit 110 may generate dithered clock signals DCLK.1-DCLK.N having dithered rising edges. In another embodiment, the dithering unit 110 may generate dithered clock signals DCLK.1-DCLK.N having dithered falling edges. In an embodiment, the routing unit 120 may include a system of multiplexers (MUXs) and/or a controller for controlling the random distribution of the dithered clock signals DCLK.1-DCLK.M to the sampling devices 130.1-130.M via the sampling clock signals SCLK.1-SCLK.M FIG. 2 illustrates configurations for a dithering unit according to an embodiment of the present invention. As illustrated in FIG. 2(a), the dithering unit 200 may include a controller 210 receiving a master clock (MCLK), and a plurality of flip-flops (FF.1-FF.N), each having a data input (D) coupled to a control signal (CTRL) from the a controller 210, a clock input coupled to the master clock MCLK, and an output for a dithered clock signal DCLK.1-DCLK.N. Each flip-flop may further have a reset input coupled to a reset (RST) signal from the controller 210. The master clock MCLK may be an externally supplied clock which may comprise a series of pulses—a primary pulse to cause each of the dithered clock signals DCLK.1-DCLK.N to begin, and a plurality of secondary clock pulses each of which cause a respective dithered clock signal DCLK.1-DCLK.N to end. The plurality of secondary clock pulses may be referred to hereafter as the "dithering interval" (DI).

During operation, the controller 210 may receive the primary pulse from the master clock MCLK. In response, the controller 210 may enable each flip-flop FF.1-FF.N using the respective reset RST and data inputs (D) such that each may begin to generate a respective dithered clock signal. For each of the received secondary clock pulses, the controller 210 may successively disable each flip-flop FF.1-FF.N on a corresponding secondary clock pulse. The dithered clock signals DCLK.1-DCLK.N may each have a predetermined clock interval related to the master clock MCLK. Each clock interval may end during the dithering interval DI at times offset from each other. The dithered clock signals DCLK.1-DCLK.N may be input to a routing unit (e.g., routing unit 120 of FIG. 1) for distribution to a plurality of sampling units (e.g., sampling units 130.1-130.M of FIG. 1).

In an embodiment, the master clock MCLK may set the dithering interval DI to minimize predetermined frequencies of correlated error. In an embodiment, each dithering clock interval may begin and end dependent on a rising edge of the master clock MCLK. In another embodiment, each dithering clock interval may begin and end dependent on a falling edge of the master clock MCLK.

As illustrated in FIG. 2(b), a dithering unit may include a plurality of shift registers SR.1-SR.N; and a controller 220 receiving a master clock MCLK and having outputs for a shift register clock SRCLK and a shift register control signal SRCTRL. The period for the shift register clock SRCLK may be related to the master clock MCLK. Each shift register SR.1-SR.N of the shift register array may have a predetermined bit width W. During operation, the controller 220 may load each shift register with a predetermined bit sequence via the control signal SCTRL. The controller 220 may clock each bit sequence out of each shift register according to the clock signal SRCLK. Each shift register may output a respect bit sequence that may in effect represent a dithered clock signal DCLK.1-DCLK.N.

Figure 3:
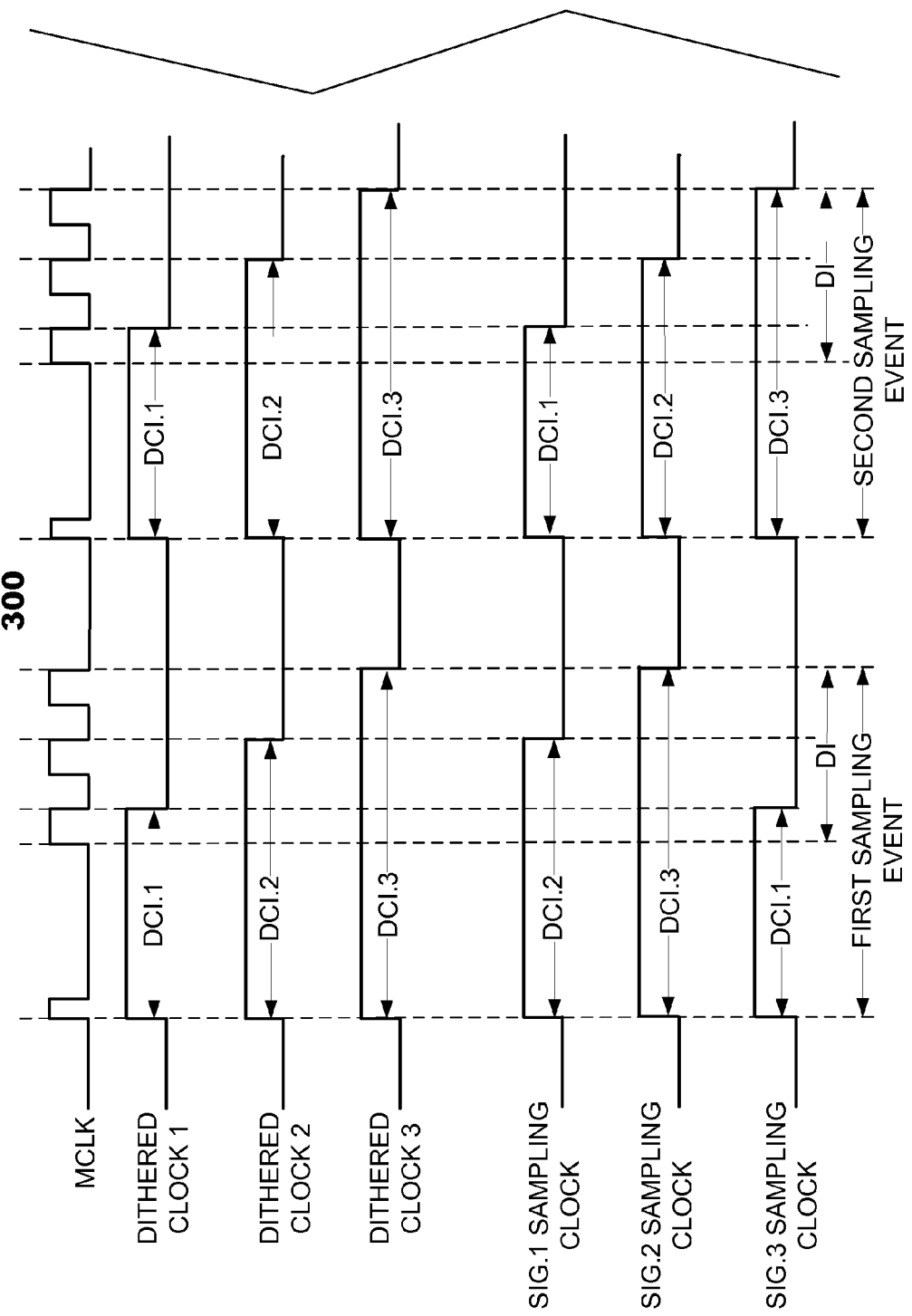
FIG. 3 illustrates a timing diagram representing simulated dithered sampling clocks for a multi-channel sampling system according to an embodiment of the present invention as described in FIG. 2.

FIG. 3 illustrates a timing diagram 300 representing simulated dithered sampling clocks for a multi-channel sampling system according to an embodiment of the present invention as described in FIG. 2. As illustrated in FIG. 3, each of a data signal SIG.1-SIG.3 may have respective sampling clocks for each sampling event of the signals SIG.1-SIG.3. A simulated master clock (MCLK) may be used by a dithering unit (e.g., dithering unit of FIG. 2(a)) to generate dithered clocks 1-N each having a respective clock interval DCI.1-DCI.3. The length of the respective dithered clock intervals DCI.1-DCI.3 may be related to the dithering interval DI which may be set by the master clock MCLK.

A routing unit (e.g., routing unit 120 of FIG. 1) may distribute each of a dithered clock 1-3 to each of a sampling device (e.g., sampling devices 130.1-130.M of FIG. 1) for each sampling event of a respective data signal SIG.1-SIG.3. As illustrated, SIG.1 may have a sampling clock for a first sampling event that is set by dithered clock 2, while the SIG.1 sampling clock for a second sampling event is set by dithered clock 1. Data signals SIG.2 and SIG.3 may have their respective sampling events set in a similar manner.

Figure 4:
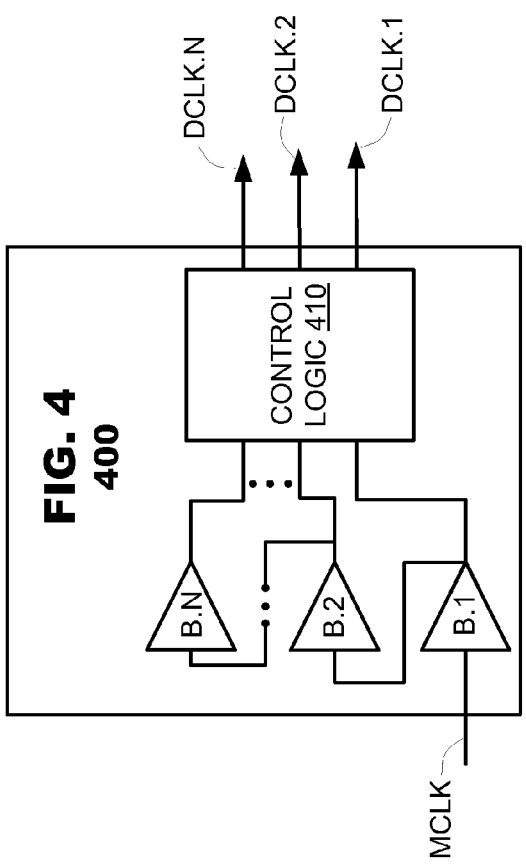
FIG. 4 illustrates another configuration for a dithering unit according to an embodiment of the present invention.

FIG. 4 illustrates another configuration 400 for a dithering unit according to an embodiment of the present invention. As illustrated in FIG. 4, the dithering unit may include a plurality of cascaded buffers B.1-B.N wherein the first buffer of the array may receive a master clock (MCLK). Each buffer B.1-B.N may have a predetermined delay. The master clock MCLK may be configured as a 50% duty cycle clock. The output of each buffer B.1-B.N may be coupled to control logic 410. During operation, the first buffer B.1 may receive the master clock MCLK. Following the predetermined buffer delay, the delayed clock may propagate to the next buffer B.2, and so on. Each buffer B.1-B.N may generate a respective clock signal which may be driven into the control logic 410. The control logic 410 may align the respective dithered clock signals DCLK.1-DCLK.N to have a common rising or falling edge. The alignment may be related to the total buffer delay (or dithering delay) for the cascaded buffers B.1-B.N. The dithered clock signals DCLK.1-DCLK.N may be input to a routing unit (e.g., routing unit 120 of FIG. 1) for distribution to a plurality of sampling units (e.g., sampling units 130.1-130.M of FIG. 1).

Figure 5:
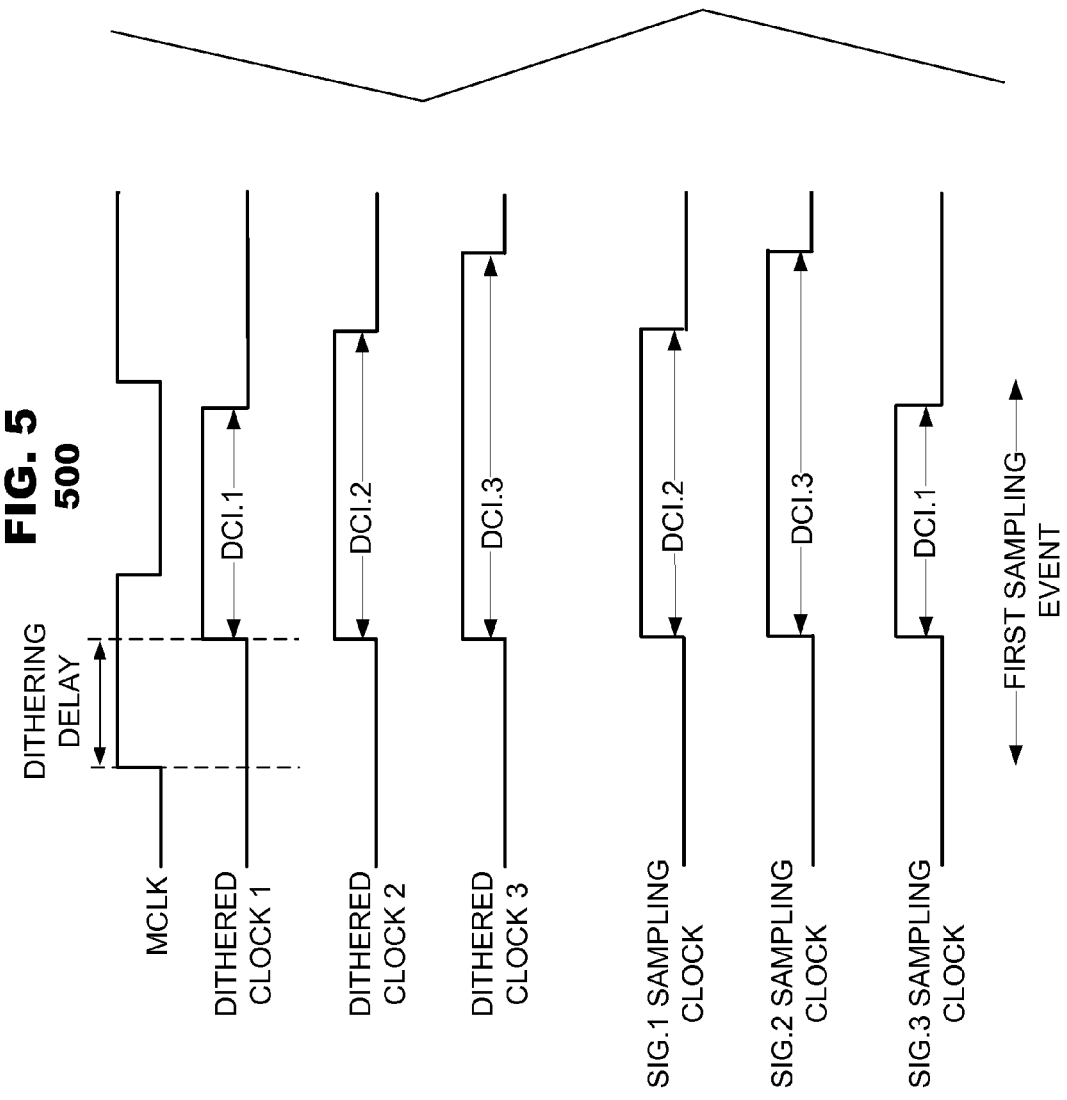
FIG. 5 illustrates a timing diagram representing simulated dithered sampling clocks for a multi-channel sampling system according to an embodiment of the present invention as described in FIG. 4.

FIG. 5 illustrates a timing diagram 500 representing simulated dithered sampling clocks for a multi-channel sampling system according to an embodiment of the present invention as described in FIG. 4. As illustrated in FIG. 5, each of a data signal SIG.1-SIG.3 may have respective sampling clocks for each sampling event of the signals SIG.1-SIG.3. A simulated master clock (MCLK) may be used by a dithering unit (e.g., dithering unit of FIG. 4) to generate dithered clocks 1-N each having a respective clock interval DCI.1-DCI.3. Alignment for the dithered for the rising edges of the dithered clocks may be related to the total delay in the dithering unit. The dithered clocks 1-N may be suitable for use with sampling systems that capture on a falling edge of the dithered clocks.

Figure 6:
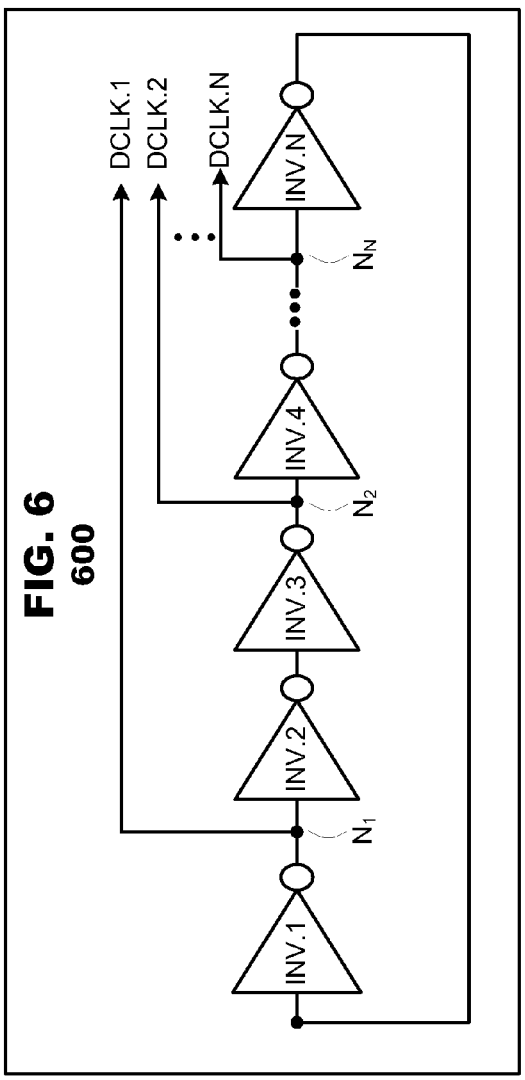
FIG. 6 illustrates another configuration for a dithering unit according to an embodiment of the present invention.

FIG. 6 illustrates another configuration 600 for a dithering unit according to an embodiment of the present invention. As illustrated in FIG. 6, the dithering unit may include a plurality of cascaded inverters INV.1-INV.N, otherwise known as a ring oscillator. Each inverter may be configured with a predetermined delay. Intermediate nodes $N_1$-$N_N$ may be formed between each of the cascaded inverters. Each of a dithering clock DCLK.1-DCLK.N may be routed from a respective 2N−1 intermediate node formed between alternating inverters. A controller (not shown) may manager operation of the dithering unit. The dithering unit may not require a master clock for operation; rather, initialization of the cascaded inverters may generate each of a dithered clock signal DCLK.1-DCLK.N. The 50% duty cycle for each dithered clock DCLK.1-DCLK.N may be proportional to the number of cascaded inverter INV.1-INV.N delays present in the dithering unit. For example, a dithering unit having 16 cascaded inverters INV.1-INV.16, each with a 1 unit time delay may generate 16 dithered clock signals DCLK.1-DCLK.16, each having a 16 unit time delay.

During operation, the controller may initialize the dithering unit to begin generating the dithered clock signals. Based on the number of inverters present in the dithering unit, the controller may determine the 50% duty cycle for the dithering unit. The controller may parse the dithered clock signals DCLK.1-DCLK.N according to the period of their respective duty cycles which may remain high. The parsed clock signals may be fed to a routing unit (e.g., routing unit 120 of FIG. 1) for distribution to a plurality of sampling units (e.g., sampling units 130.1-130.M of FIG. 1).

In various embodiments, the number of N cascaded inverters INV.1-INV.N may be implemented using odd or even numbers of inverters. For an embodiment implemented using an odd number of inverters, each of a dithered clock signal may be routed from a respective N intermediate node formed between alternating inverters. In an embodiment, the predetermined delay for each of the inverters INV.1-INV.N may be a unit delay. In another embodiment, the predetermined delay for each of the inverters INV.1-INV.N may be variable among the inverters.

Figure 7:
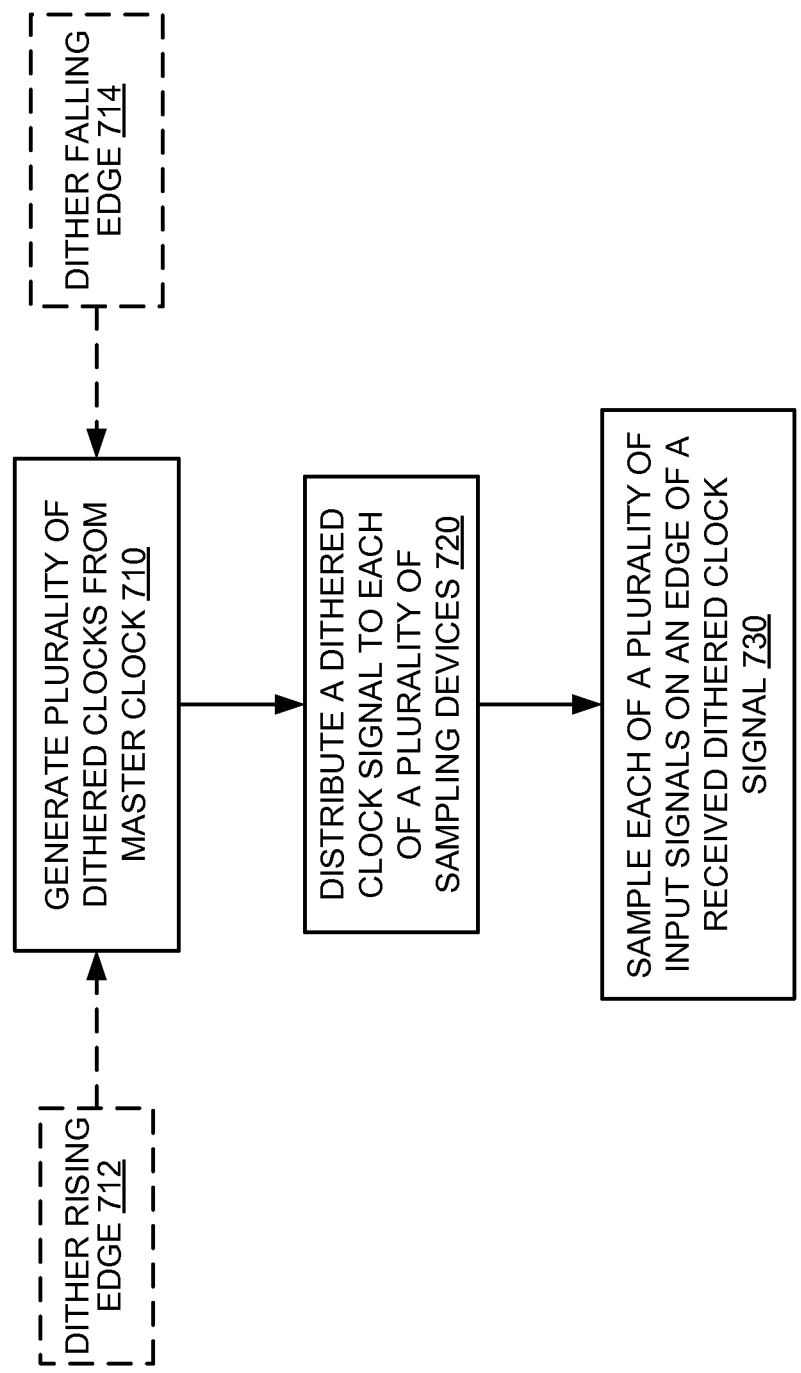
FIG. 7 illustrates a method for dithering a sampling event for a plurality of data signals according to an embodiment of the present invention.

FIG. 7 illustrates a method 700 for dithering a sampling event for a plurality of data signals according to an embodiment of the present invention. The method may generate a plurality of dithered clock signals from a master clock, wherein each dithered clock signal may have a unique clock interval offset related to the master clock (block 710). The method 700 may distribute a dithered clock signal to each of a plurality of sampling devices in a random manner (block 720). The method 700 may capture each of a plurality of input signals with each of the plurality of sampling devices on an edge of its received dithered clock signal (block 730).

In an embodiment, the method 700 may generate dithered sampling clocks having dithered rising edges (block 712). In an embodiment, the method 700 may generate dithered sampling clocks having dithered falling edges (block 714).

Figure 8:
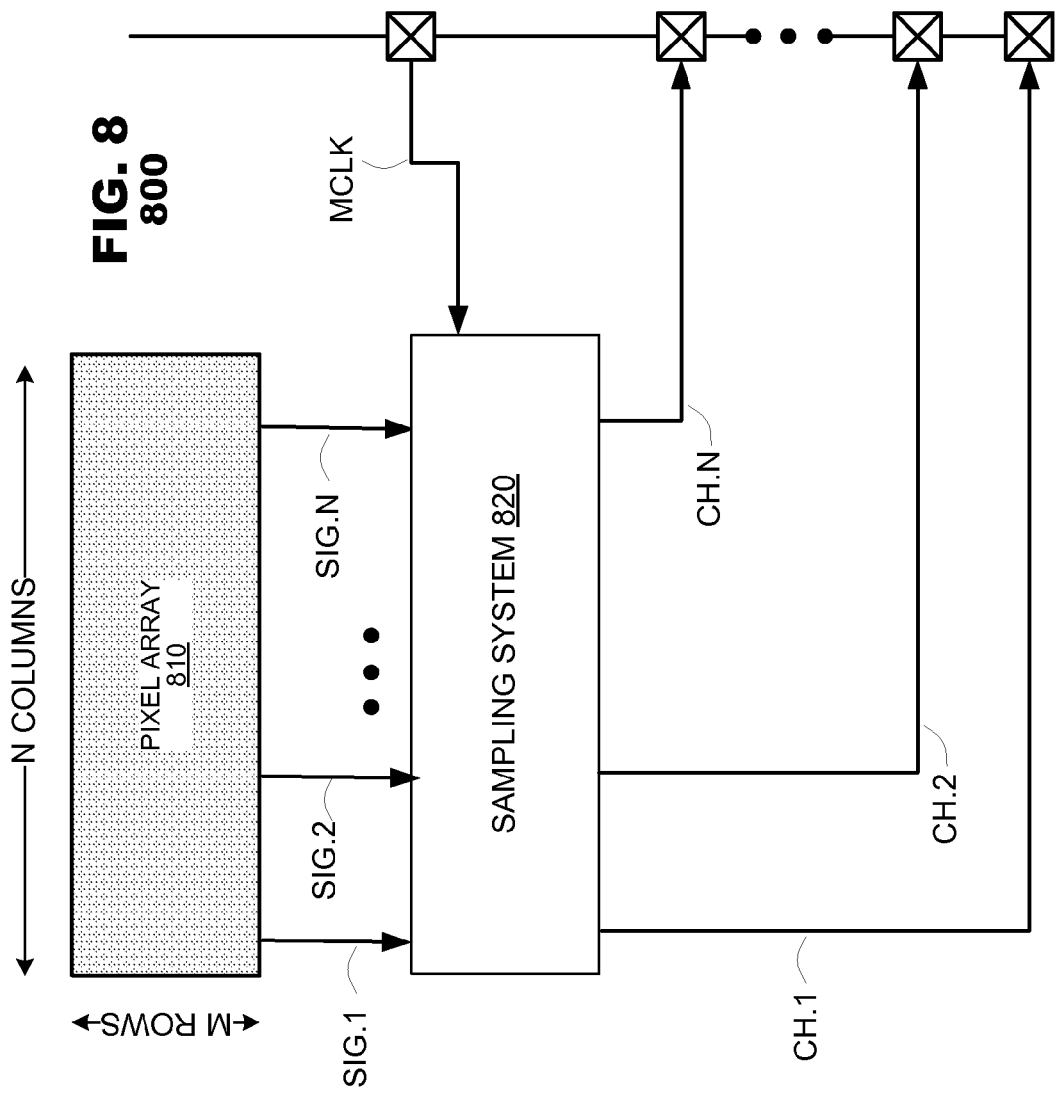
FIG. 8 illustrates a multi-channel image processing system for use with foregoing embodiments of the present invention.

FIG. 8 illustrates a multi-channel image processing system 800 according to an embodiment of the present invention. The system 800 may be fabricated in a common IC and may include a pixel array 810 having a plurality of pixel circuits arranged into an array of M rows and N columns wherein each column may output a data signal SIG.1-SIG.M and a multi-channel sampling system 820 having inputs for each of the data signals SIG.1-SIG.M and a master clock MCLK, and having outputs representing sampled data signals (channels CH.1-CH.M). The multi-channel sampling system 820 may be configured similar to the sampling system 100 of FIG. 1 having a dithering unit, a routing unit, and a plurality of sampling devices.

During operation, the pixel array 810 may generate image signals SIG.1-SIG.N which may feed the sampling system 820. The sampling system 820 may dither each sampling event for each of the image signals SIG.1-SIG.N to generate the sampled data signals CH.1-CH.N. Dithering each of the sampling events for each of the image signals SIG.1-SIG.N may reduce correlated noise between the sampled data signals CH.1-CH.N.

FIG. 9 provides images 900 illustrating correlated noise reduction for an image processing system using techniques of the foregoing embodiments of the present invention. The images 900 have been generated from a prototype multi-channel sampling system. As illustrated in the simulation in FIG. 9(*a*), correlated noise may be present when each of a sampling interval for each of a plurality of channels received from a pixel array may not be dithered. The noise may be indicated by vertical lines present in the channel samples. As illustrated in the simulation in FIG. 9(*b*), correlated noise may be reduced when each of a sampling interval for each of a plurality channels received from a pixel array may be dithered. As indicated, the vertical lines may not be present in the channel samples of FIG. 9(*b*).

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

I claim:

1. A multi-channel sampling system, comprising:
   a plurality of sampling devices;

a dithering unit for generating a plurality of sub-clock signals from a master clock signal, each sub-clock signal having an edge offset from edges of other sub-clock signals;
a router unit to distribute the sub-clock signals to the sampling devices and to change the distribution of the sub-clock signals to the sampling device; and
each of the plurality of sampling devices capturing respective input data signals according to an edge of a respective sub-clock.

2. The system of claim 1, wherein the system is manufactured in an integrated circuit chip.

3. The system of claim 1, wherein the generated clock signals have rising edges offset from each other.

4. The system of claim 1, wherein the generated clock signals have falling edges offset from each other.

5. The system of claim 1, wherein the router unit distributes the sub-clock signals to the sampling devices in a pseudo-random manner.

6. The system of claim 1, wherein the dithering unit further comprises:
a controller receiving the master clock; and
a plurality of flip-flops each receiving a control signal and a reset signal from the controller and the master clock.

7. The system of claim 1, wherein the dithering unit further comprises:
a controller receiving the master clock and generating a reset signal and a controller clock signal; and
a plurality of shift registers having a predetermined bit width each receiving the reset signal and the controller clock signal.

8. The system of claim 1, wherein the dithering unit further comprises:
a plurality of cascaded buffers each having a predetermined buffer delay, wherein the first buffer in the cascade receiving the master clock.

9. The system of claim 1, wherein the edge offset from edges of other sub-clock signals is within a dithering interval defined by the master clock signal.

10. A multi-channel sampling system, comprising;
a plurality of sampling devices;
a dithering unit for generating a plurality of sub-clock signals from a master clock signal, each sub-clock signal having an edge offset from edges of other sub-clock signal;
a router unit to distribute the sub-clock signals to the sampling devices; and
each of the plurality of sampling devices capturing respective input data signals according to an edge of a respective sub-clock, wherein the distributing configuration of the router changes on successive master clock cycles.

11. An image sensor system, comprising:
a pixel array;
a plurality of sampling devices coupled to respective outputs of the pixel array, and having a clock input;
a clock system, comprising:
a dithering unit for generating a plurality of sub-clock signals from a master clock signal, each sub-clock signal having an edge offset from edges of other sub-clock signals; and
a router unit to distribute the sub-clock signals to the sampling devices and to change the distribution of the sub-clock signals to the sampling devices.

12. A method for dithering a sampling event for a plurality of data signals, comprising:
generating a plurality of sub-clock signals from a master clock, wherein the generated sub-clock signals have clock edges offset from each other;
distributing the generated sub-clock signals to a plurality of sampling devices;
changing the distribution of the generated sub-clock signals to the plurality of sampling devices; and
capturing an input signal at each sampling device at a time determined by its received sub-clock signal.

13. The method of claim 12, wherein the distributing is performed in a pseudo-random manner.

14. The method of claim 12, wherein the master clock comprises a 50% duty cycle clock.

15. The method of claim 12, wherein the number of sampling devices is greater than the number of sub-clock signals.

16. The method of claim 12, wherein the number of sampling devices is equal to the number of sub-clock signals.

17. The method of claim 12, wherein the number of sampling devices is less than the number of sub-clock signals.

18. The method of claim 12, wherein the generated clock signals have rising edges offset from each other.

19. The method of claim 12, wherein the generated clock signals have falling edges offset from each other.

20. A method for dithering a sampling event for a plurality of data signals, comprising:
generating a plurality of sub-clock signals from a master clock, wherein the generated sub-clock signals have clock edges offsets from each other;
distributing the generated sub-clock signals to a plurality of sampling devices;
capturing an input signal at each sampling device at a time determined by its received sub-clock signal, wherein the distributing is reconfigured between successive cycles of the master clock.

21. A method for dithering a sampling event for a plurality of data signals, comprising:
generating a plurality of sub-clock signal from a master clock, wherein the generated sub-clock signals have clock edges offset from each other;
distributing the generated sub-clock signals to a plurality of sampling device; capturing an input signal at each sampling device at a time determined by its received sub-clock signal, wherein the master clock comprises a primary pulse followed by a plurality of secondary pulses within a dithering interval.

22. A multi-channel sampling system, comprising:
a dithering unit for generating a plurality of sub-clock signals from a master clock signal, each sub-clock signal having first type edges offset from first edges of other sub-clock signals and having second edges aligned with second type edges of the other sub-clock signals;
a plurality of sampling devices each to capture respective input data signals according to a first type edge of a respective sub-clock; and
a router unit to distribute the sub-clock signals to the sampling devices.

23. A multi-channel sampling system, comprising:
a plurality of sampling devices;
a dithering unit for generating a plurality of sub-clock signals from a master clock signal, the sub-clock signals having dithered edges within a dithering interval defined by the master clock signal;
a router unit to distribute the sub-clock signals to the sampling devices; and
each of the plurality of sampling devices capturing respective input data signals according to an edge of a respective sub-clock.

24. A method for dithering a sampling event for a plurality of data signals, comprising:
- generating a plurality of sub-clock signals from a master clock, wherein the generated sub-clock signals have first edges aligned with each other and second edges with mutual offsets with respect to each other;
- distributing the generated sub-clock signals to a plurality of sampling devices; and
- capturing an input signal at each sampling device at a time determined by its received sub-clock signal.

25. The method of claim 24, further comprising changing the distribution of the generated sub-clock signals to the plurality of sampling devices.

* * * * *